(12) United States Patent
Cao et al.

(10) Patent No.: US 11,968,872 B2
(45) Date of Patent: Apr. 23, 2024

(54) DISPLAY SUBSTRATE INCLUDING FIRST AND SECOND CORNER DISPLAY REGIONS HAVING DIFFERENT LAYER THICKNESS AND HOLE REGIONS

(71) Applicant: BOE Technology Group Co., Ltd., Beijing (CN)

(72) Inventors: Fangxu Cao, Beijing (CN); Jia Zhao, Beijing (CN); Pinfan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/316,734

(22) Filed: May 11, 2021

(65) Prior Publication Data

US 2022/0123064 A1 Apr. 21, 2022

(30) Foreign Application Priority Data

Oct. 20, 2020 (CN) .......................... 202011122805.5

(51) Int. Cl.
*H10K 59/35* (2023.01)
*H10K 59/12* (2023.01)
(Continued)

(52) U.S. Cl.
CPC ......... *H10K 59/353* (2023.02); *H10K 59/131* (2023.02); *H10K 71/00* (2023.02); *H10K 59/1201* (2023.02)

(58) Field of Classification Search
CPC ............. H01L 27/3218; H01L 27/3276; H01L 51/0097; H01L 51/56; H01L 2227/323;
(Continued)

(56) References Cited

U.S. PATENT DOCUMENTS

2014/0138637 A1* 5/2014 Yang .................... H01L 27/1248
257/40
2021/0384465 A1* 12/2021 Park ..................... H01L 27/326
(Continued)

FOREIGN PATENT DOCUMENTS

| CN | 111243442 A | 6/2020 |
| CN | 111682049 A | 9/2020 |
| KR | 10-2015-0006706 A | 1/2015 |

OTHER PUBLICATIONS

Office Action dated Nov. 15, 2023 for Chinese Patent Application No. 2020111228055 and English Translation.

*Primary Examiner* — Matthew E. Gordon
(74) *Attorney, Agent, or Firm* — Ling Wu; Stephen Yang; Ling and Yang Intellectual Property

(57) ABSTRACT

A display substrate, a manufacturing method thereof and a display apparatus are provided. The display substrate includes a display region and a bezel region. The display region includes a plurality of sub-pixels, and the display region includes a main display region and a plurality of corner display regions. The corner display region includes a first display region and a second display region, a distance between a center point of the first display region and a center point of the main display region is smaller than a distance between a center point of the second display region and the center point of the main display region; and a structure of sub-pixels of the first display region is different from a structure of sub-pixels of the second display region.

15 Claims, 6 Drawing Sheets

(51) Int. Cl.
*H10K 59/131* (2023.01)
*H10K 71/00* (2023.01)

(58) Field of Classification Search
CPC ............ H01L 2251/5338; H10K 59/12; H10K 59/131; H10K 59/353; H10K 71/00; H10K 71/40; H10K 71/421; H10K 71/441
USPC .......................................................... 257/40
See application file for complete search history.

(56) References Cited

U.S. PATENT DOCUMENTS

| | | |
|---|---|---|
| 2022/0384545 A1 | 12/2022 | Shen et al. |
| 2023/0157146 A1 | 5/2023 | Han |

\* cited by examiner forming, on a substrate, a driving structure layer, a structure of the driving structure layer formed in the first display region being different from a structure of the driving structure layer formed in the second display region — S1 forming, on the driving structure layer, a light emitting structure layer — S2

FIG. 11

DISPLAY SUBSTRATE INCLUDING FIRST AND SECOND CORNER DISPLAY REGIONS HAVING DIFFERENT LAYER THICKNESS AND HOLE REGIONS

CROSS-REFERENCE TO RELATED APPLICATION

The present application claims the priority of Chinese Patent Application No. 202011122805.5 filed to the CNIPA on Oct. 20, 2020, the entire content of which is hereby incorporated by reference.

TECHNICAL FIELD

Embodiments of the present disclosure relate to, but are not limited to, the field of display technology, and particularly relate to a display substrate and a manufacturing method thereof, and a display apparatus.

BACKGROUND

With the development of display technology, curved screens have become a hot topic in the display field. Curved screens include hyperbolic screens formed by making two opposite sides of a display screen have certain curved radians, and four curved surface screens formed by making four sides of the display screen have certain curved radians, among which four curved surface screens achieve comprehensive stereoscopic display, create a sense of stereoscopic immersion, bring better sensory experience to users, and conform to the development trend of future technologies.

SUMMARY

The following is a summary of the subject matter described in detail in the present disclosure. This summary is not intended to limit the protection scope of the claims.

An embodiment of the present disclosure provides a display substrate, including a display region and a bezel region, the display region includes a plurality of sub-pixels, and the display region includes a main display region and a plurality of corner display regions, wherein: the corner display region includes a first display region and a second display region, a distance between a center point of the first display region and a center point of the main display region is smaller than a distance between a center point of the second display region and the center point of the main display region; and a structure of sub-pixels of the first display region is different from a structure of sub-pixels of the second display region.

In some exemplary embodiments, on a direction perpendicular to the display substrate, the display substrate includes a substrate and a driving structure layer and a light emitting structure layer stacked on the substrate, the driving structure layer includes a barrier layer, an active layer disposed on the barrier layer, a first insulating layer disposed on the active layer, a first gate electrode layer disposed on the first insulating layer, a second insulating layer disposed on the first gate electrode layer, a second gate electrode layer disposed on the second insulating layer, a third insulating layer disposed on the second gate electrode layer, and a source-drain electrode layer disposed on the third insulating layer, and a thickness of at least one of the barrier layer, the first insulating layer, the second insulating layer, and the third insulating layer on the second display region is smaller than a thickness of it on the first display region.

In some exemplary embodiments, on a direction perpendicular to the display substrate, the display substrate includes a substrate and a driving structure layer and a light emitting structure layer stacked on the substrate, the driving structure layer includes a barrier layer, an active layer disposed on the barrier layer, a first insulating layer disposed on the active layer, a first gate electrode layer disposed on the first insulating layer, a second insulating layer disposed on the first gate electrode layer, a second gate electrode layer disposed on the second insulating layer, a third insulating layer disposed on the second gate electrode layer, and a source-drain electrode layer disposed on the third insulating layer, and a thickness of at least one of the barrier layer, the first insulating layer, the second insulating layer, and the third insulating layer on the first display region is smaller than a thickness of it on the main display region; and
  the second display region is provided with a plurality of island regions separated from each other, hole regions disposed between adjacent island regions, and bridge regions connecting adjacent island regions, wherein sub-pixels of the second display region are disposed in the island regions, the bridge regions are provided with connecting wires for realizing signal communication between adjacent island regions, and the hole regions are provided with at least one opening.

In some exemplary embodiments, the first display region is provided with a plurality of first island regions separated from each other, first hole regions disposed between adjacent first island regions and first bridge regions connecting adjacent first island regions, wherein the first island regions are provided with sub-pixels of the first display region, the first bridge regions are provided with connecting wires for realizing signal communication between adjacent first island regions, and the first hole regions are provided with at least one first opening;
  the second display region is provided with a plurality of second island regions separated from each other, second hole regions disposed between adjacent second island regions and second bridge regions connecting adjacent second island regions, wherein the second island regions are provided with sub-pixels of the second display region, the second bridge regions are provided with connecting wires for realizing signal communication between adjacent second island regions, and the second hole regions are provided with at least one second opening; and
  a pattern of the at least one first opening is different from a pattern of the at least one second opening, and an orthographic projection area of the at least one first opening on the substrate is smaller than an orthographic projection area of the at least one second opening on the substrate.

In some exemplary embodiments, the first display region is provided with a plurality of first island regions separated from each other, first hole regions disposed between adjacent first island regions and first bridge regions connecting adjacent first island regions, wherein the first island regions are provided with sub-pixels of the first display region, the first bridge regions are provided with connecting wires for realizing signal communication between adjacent first island regions, and the first hole regions are provided with at least one first opening;
  the second display region is provided with a plurality of second island regions separated from each other, second hole regions disposed between adjacent second island regions and second bridge regions connecting adjacent second island regions, wherein the second island regions are provided with sub-pixels of the second display region, the second bridge regions are provided with connecting wires for realizing signal communication between adjacent second island regions, and the second hole regions are provided with at least one second opening; and a pattern of the at least one first opening is the same as a pattern of the at least one second opening, and a size of the at least one first opening is smaller than a size of the at least one second opening.

In some exemplary embodiments, the first display region includes a first sub-region and a second sub-region, wherein the first sub-region is located between the second sub-region and the main display region; and the second sub-region is located between the second display region and the first sub-region.

In some exemplary embodiments, the corner display region include a first fan-shaped region located at a side of the main display region and a second annular region located at a side of the first fan-shaped region away from the main display region, and the first sub-region is located in the first fan-shaped region, wherein each of the corner display regions includes two second sub-regions, the two second sub-regions and the second display region are all located in the second annular region, and the second display region is located between the two second sub-regions.

In some exemplary embodiments, the second display region includes a third sub-region and a fourth sub-region, wherein the third sub-region is located between the fourth sub-region and the first display region, and the fourth sub-region is located at a side of the third sub-region away from the main display region.

In some exemplary embodiments, the third sub-region is provided with a plurality of first island regions separated from each other, first hole regions disposed between adjacent first island regions and first bridge regions connecting adjacent first island regions, wherein the first island regions are provided with sub-pixels of the first display region, the first bridge regions are provided with connecting wires for realizing signal communication between adjacent first island regions, and the first hole regions are provided with at least one first opening;

the fourth sub-region is provided with a plurality of second island regions separated from each other, second hole regions disposed between adjacent second island regions and second bridge regions connecting adjacent second island regions, wherein the second island regions are provided with sub-pixels of the second display region, the second bridge regions are provided with connecting wires for realizing signal communication between adjacent second island regions, and the second hole regions are provided with at least one second opening; and a pattern of the first opening is different from a pattern of the second opening, and an orthographic projection area of the first opening on the substrate is smaller than an orthographic projection area of the second opening on the substrate, or the pattern of the first opening is the same as the pattern of the second opening, and a size of the first opening is smaller than a size of the second opening.

An embodiment of the present disclosure further provides a display apparatus which includes any display substrate of the aforementioned embodiments.

An embodiment of the present disclosure further provides a manufacturing method of a display substrate, the display substrate includes a display region and a bezel region, the display region includes a plurality of sub-pixels, the display region includes a main display region and a plurality of corner display regions, the plurality of corner display regions includes a first display region and a second display region, and the second display region is located at a side of the first display region far away from the main display region, the manufacturing method includes:

forming, on a substrate, a driving structure layer, a structure of the driving structure layer formed in the first display region being different from a structure of the driving structure layer formed in the second display region; and forming, on the driving structure layer, a light emitting structure layer.

Of course, an implementation of any product or method in the embodiments of the present disclosure does not need to achieve all the advantages mentioned above at the same time. Other features and advantages of the present disclosure will be set forth in embodiments disclosed below, and in part will become apparent from the embodiments of the present disclosure, or may be learned by practice the embodiments of the present disclosure. Purposes and other advantages of the technical schemes of the present disclosure may be achieved and acquired by structures specified in the detailed description and drawings.

Other aspects will become apparent upon reading and understanding accompanying drawings and the detailed description.

BRIEF DESCRIPTION OF DRAWINGS

The attached drawings are used to provide a further understanding of the technical solution of the present disclosure, and constitute a part of the specification. They are used together with the embodiments of the present application to explain the technical solution of the present disclosure, and do not constitute a restriction on the technical solution of the present disclosure. Shapes and sizes of the components in the drawings do not reflect true proportions and only to be used to schematically illustrate contents of the present disclosure.

FIG. 11 is a flowchart of a manufacturing method for display substrate according to an exemplary embodiment.

DETAILED DESCRIPTION

Figure 1:
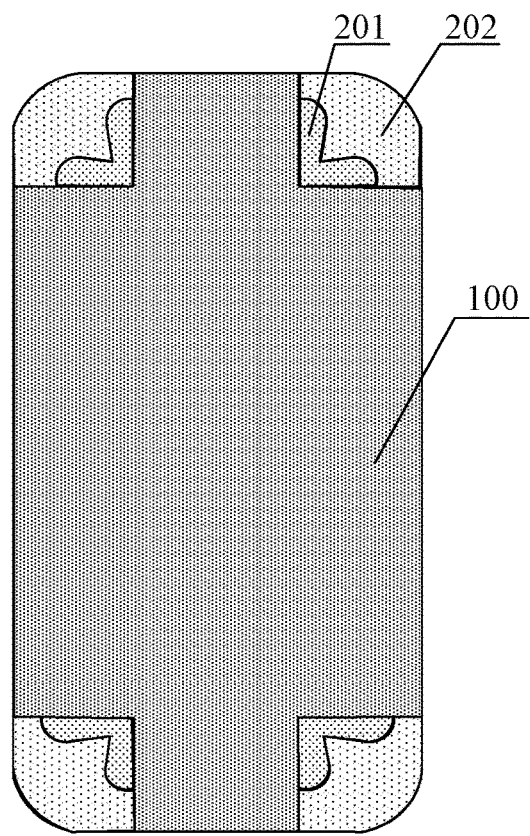
FIG. 1 is a schematic diagram of a structure of a display substrate according to an embodiment of the present disclosure.

Hereinafter embodiments of the present disclosure will be described in detail with reference to the accompanying drawings. The embodiments may be implemented in a number of different forms. Those of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the accompanying drawings, sizes of constituent elements and thicknesses and areas of layers are sometimes exaggerated for clarity. Therefore, an implementation of the present disclosure is not necessarily limited to the sizes shown. The shapes and sizes of components in the accompanying drawings do not reflect true proportions. In addition, the drawings schematically show ideal examples, and an implementation of the present disclosure is not limited to the shapes or numerical values shown in the drawings.

The "first", "second", "third" and other ordinal numbers in the embodiments of the present disclosure are used to avoid confusion of constituent elements, not to provide any quantitative limitation.

In the embodiments of the present disclosure, for the sake of convenience, wordings such as "central", "upper", "lower", "front", "rear", "vertical", "horizontal", "top", "bottom", "inner", "outer" and the others describing the orientations or positional relations are used to depict the relations between constituent elements with reference to the accompanying drawings, which are only for an easy and simplified description in the present disclosure, rather than for indicating or implying that the device or element referred to must have a specific orientation, or must be constructed and operated in a particular orientation and therefore, those wordings cannot be construed as limitations on the present disclosure. The positional relations of the constituent elements may be appropriately changed according to the direction in which each constituent element is described. Therefore, they are not limited to the wordings in this disclosure, and may be replaced appropriately according to the situations.

In the embodiments of the present disclosure, the terms "install", "connect" and "couple" shall be broadly understood unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal connection between two elements. Those of ordinary skills in the art can understand the specific meanings of the above mentioned terms in the present disclosure according to specific context.

In the embodiments of present disclosure, a transistor refers to an element including at least three terminals, namely, a gate electrode, a drain electrode and a source electrode. The transistor has a channel region between the drain electrode (a drain electrode terminal, a drain region or a drain electrode) and the source electrode (a source electrode terminal, a source region or a source electrode), and a current may flow through the drain electrode, the channel region and the source electrode. It should be noted that in the embodiments of the present disclosure, a channel region refers to a region through which the current mainly flows.

In the embodiments of the present disclosure, a first electrode may be a drain electrode while a second electrode may be a source electrode, or a first electrode may be a source electrode while a second electrode may be a drain electrode. The functions of the "source electrode" and that of the "drain electrode" are interchangeable under circumstances where transistors with opposite polarities are used or where the current direction changes during circuit operation. Therefore, in the embodiments of the present disclosure, "source electrodes" and "drain electrodes" are interchangeable.

In the embodiments of the present disclosure, "an electrical connection" includes a case where constituent elements are connected via an element having a certain electrical action. The "element having a certain electrical action" is not particularly limited as long as it can transmit and receive electrical signals between connected constituent elements. Examples of the "elements having a certain electrical function" include not only electrodes and wirings, but also switching elements such as transistors, resistors, inductors, capacitors, and other elements having various functions.

In the embodiments of the present disclosure, "parallel" refers to a state in which two straight lines form an angle above −10 degrees and below 10 degrees, and thus also includes a state in which the angle is above −5 degrees and below 5 degrees. In addition, "vertical" refers to a state in which two straight lines form an angle between 80 degrees and 100 degrees and thus, includes a state in which the angle is between 85 and 95 degrees.

In the embodiments of the present disclosure, "film" and "layer" may be interchanged. For example, sometimes "conductive layer" may be replaced by "conductive film". Similarly, "insulating film" may sometimes be replaced by "insulating layer".

In the embodiments of the present disclosure, "about" refers to a value allowed within the range of process and measurement error that is not strictly limited.

Embodiments of the present disclosure provide a display substrate including a substrate, a display region and a bezel region disposed on the substrate. The display region includes a plurality of sub-pixels, and the display region includes a main display region and a plurality of corner display regions including a first display region and a second display region. A distance between a center point of the first display region and a center point of the main display region is smaller than a distance between a center point of the second display region and the center point of the main display region. A structure of sub-pixels in the first display region is different from a structure of sub-pixels in the second display region. According to the display substrate provided by the embodiments of the present disclosure, by distinguishing design for the regions of the sub-pixels of the corner display regions, the display quality of the corner display regions is improved, demand for the deformation of the corner display regions is satisfied, and the product quality is improved.

The following describes the technical solution of the present disclosure through a plurality of exemplary embodiments.

Figure 2:
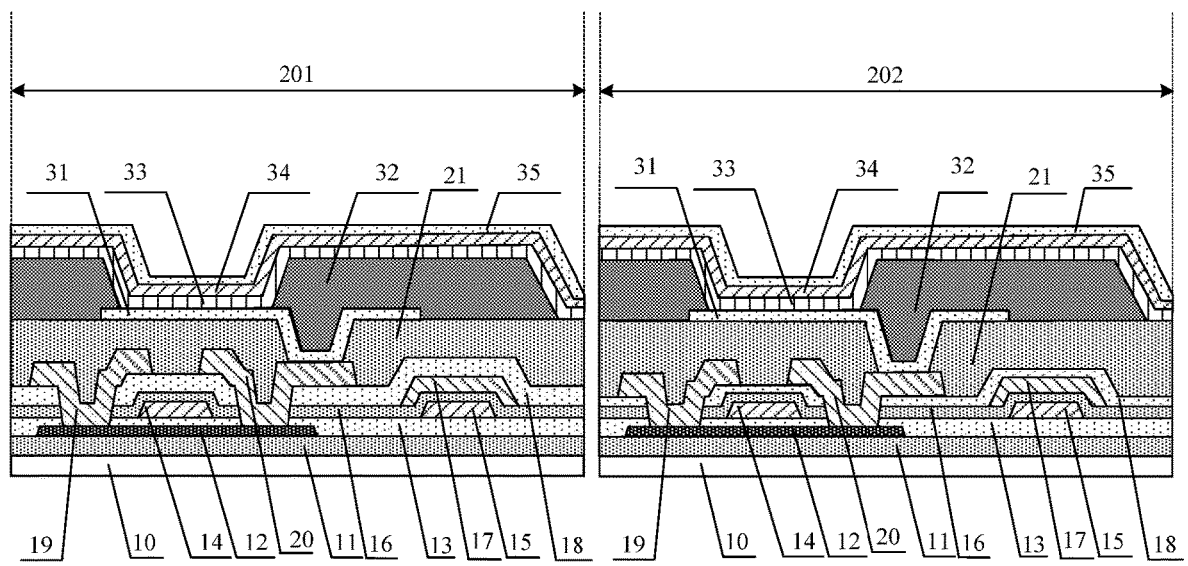
FIG. 2 is a schematic cross-sectional view of a structure of a corner display region of a display substrate shown in FIG. 1.

FIG. 1 is a schematic diagram of a structure of a display substrate according to an exemplary embodiment of the present disclosure. FIG. 2 is a schematic cross-sectional view of a structure of a corner display region of a display substrate shown in FIG. 1. As shown in FIG. 1 and FIG. 2, the display substrate includes a display region and a bezel region. The display region includes a plurality of sub-pixels. The display region includes a main display region 100 and a plurality of corner display regions including a first display region 201 and a second display region 202. A distance between a center point of the first display region 201 and a center point of the main display region 100 is smaller than a distance between a center point of the second display region 202 and the center point of the main display region 100.

On a direction perpendicular to the display substrate, the display substrate includes a substrate 10 and a driving structure layer and a light emitting structure layer stacked on the substrate 10, the driving structure layer includes a barrier layer 11, an active layer 12 disposed on the barrier layer 11, a first insulating layer 13 disposed on the active layer 12, a first gate electrode layer disposed on the first insulating layer 13, a second insulating layer 16 disposed on the first gate electrode layer, a second gate electrode layer disposed on the second insulating layer 16, a third insulating layer 18 disposed on the second gate electrode layer, and a source-drain electrode layer disposed on the third insulating layer 18.

In an exemplary embodiment, and a thickness of at least one of the barrier layer 11, the first insulating layer 13, the second insulating layer 16, and the third insulating layer 18 on the second display region 202 is smaller than a thickness of it on the first display region 201.

In this exemplary embodiment, a structure of the sub-pixels of the first display region 201 may be the same as a structure of the sub-pixels of the main display region 100. Through the processing of thinning for the inorganic layer in the second display region 202, the deformability of the first display region 201 to the second display region 202 is gradually increased.

In another exemplary embodiment, a thickness of at least one of the barrier layer 11, the first insulating layer 13, the second insulating layer 16 and the third insulating layer 18 in the first display region 201 is smaller than a thickness of it in the main display region 100.

The second display region 202 is provided with a plurality of island regions separated from each other, hole regions disposed between adjacent island regions, and bridge regions connecting the adjacent island regions. The island regions are provided with sub-pixels of the second display region 202, the bridge regions are provided with connecting wires for implementing signal communication between the adjacent island regions, and the hole regions are provided with at least one opening.

In this embodiment, the inorganic layer in the first display region 201 is thinned, and an opening structure is provided in the second display region 202, so that the deformability of the first display region 201 to the second display region 202 is gradually increased.

Figure 3:
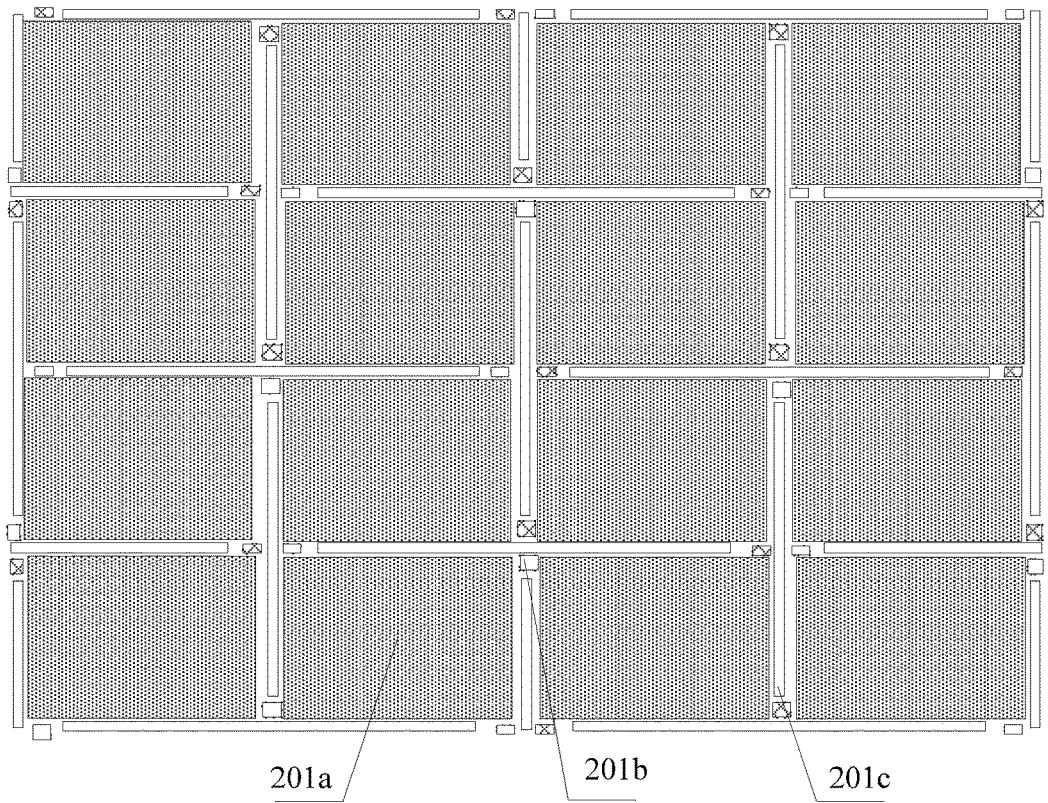
FIG. 3 is a schematic diagram of a structure of a first display region of a display substrate according to an embodiment of the present disclosure.

In an exemplary embodiment, as shown in FIG. 3, a first display region 201 is provided with a plurality of first island regions 201a separated from each other, first hole regions 201c disposed between the adjacent first island regions 201a, and first bridge regions 201b connecting the adjacent first island regions 201a. The first island regions 201a are provided with sub-pixels of the first display region 201, and the first bridge regions 201b are provided with connecting wires for implementing signal communication between the adjacent first island regions 201a, and the first hole regions 201c are provided with at least one first opening.

Figure 4:
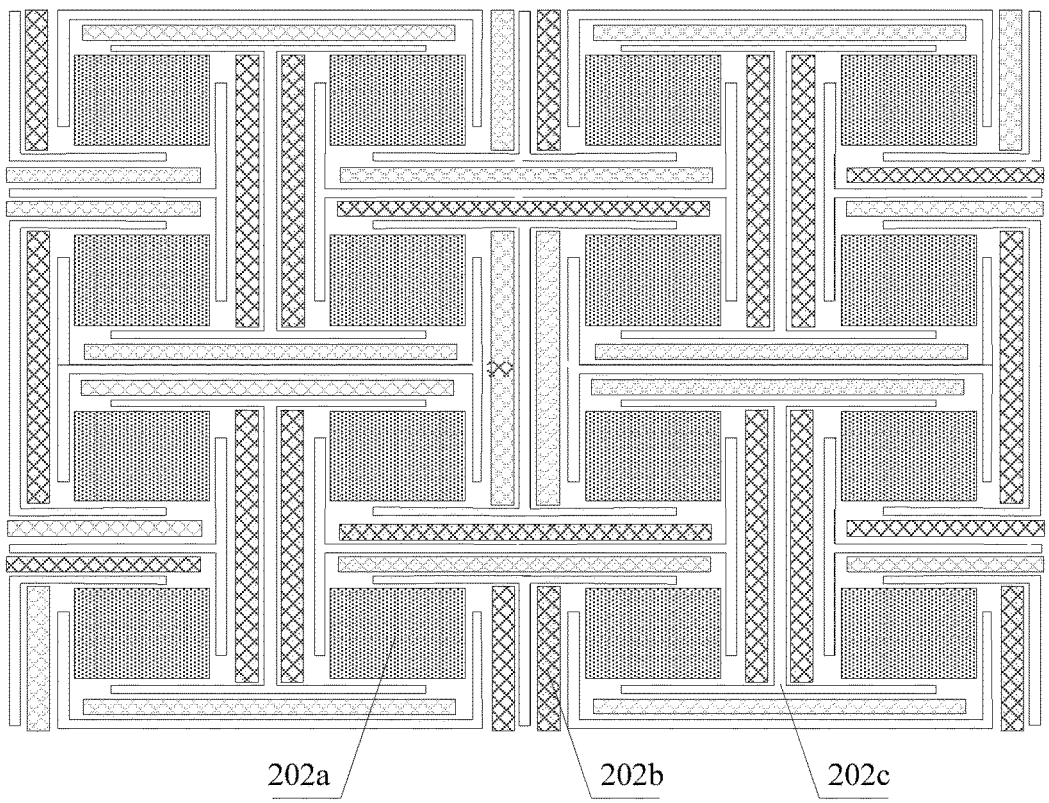
FIG. 4 is a schematic diagram of a structure of a second display region of a display substrate according to an embodiment of the present disclosure.

As shown in FIG. 4, a second display region 202 is provided with a plurality of second island regions 202a separated from each other, second hole regions 202c disposed between the adjacent second island regions 202a, and second bridge regions 202b connecting the adjacent second island regions 202a. The second island regions 202a are provided with the sub-pixels of the second display region 202, and the second bridge regions 202b are provided with connecting lines for implementing signal communication between the adjacent second island regions 202a, and the second hole regions 202c are provided with at least one second opening.

A pattern of the first opening is different from a pattern of the second opening, and an orthographic projection area of the first opening on a substrate is smaller than an orthographic projection area of the second opening on the substrate.

For example, as shown in FIG. 3 and FIG. 4, the pattern of the first opening may be straight line-shaped, and the pattern of the second opening may be I-shaped (or the pattern of the second opening may be T-shaped or I-shaped). Or, the pattern of the first opening may be T-shaped or ▯-shaped, and the pattern of the second opening may be I-shaped.

In this embodiment, both the first display region 201 and the second display region 202 are provided with opening structures. The first display region 201 and the second display region 202 are provided with different opening patterns, so that the deformability of the first display region 201 to the second display region 202 is gradually increased.

In an exemplary embodiment, the first display region 201 is provided with a plurality of first island regions 201a separated from each other, first hole regions 201c disposed between adjacent first island regions 201a, and first bridge regions 201b connecting the adjacent first island regions 201a. The first island regions 201a are provided with the sub-pixels of the first display region 201, the first bridge regions 201b are provided with connecting wires for implementing signal communication between the adjacent first island regions 201a, and the first hole regions 201c are provided with at least one first opening.

The second display region 202 is provided with a plurality of second island regions 202a separated from each other, second hole regions 202c disposed between adjacent second island regions 202a, and second bridge regions 202b connecting the adjacent second island regions 202a. The second island regions 202a are provided with the sub-pixels of the second display region 202, the second bridge regions 202b are provided with connecting lines for implementing signal communication between the adjacent second island regions 202a, and the second hole regions 202c are provided with at least one second opening.

The pattern of the first opening is the same as the pattern of the second opening, and a size of the first opening is smaller than a size of the second opening.

In this exemplary embodiment, both the first display region 201 and the second display region 202 are provided with opening structures, and the first display region 201 and the second display region 202 are provided with the same opening patterns, but a size of the opening of the second display region 202 is larger than a size of the opening of the first display region 201, so that the deformability of the first display region 201 to the second display region 202 is gradually increased.

Figure 5:
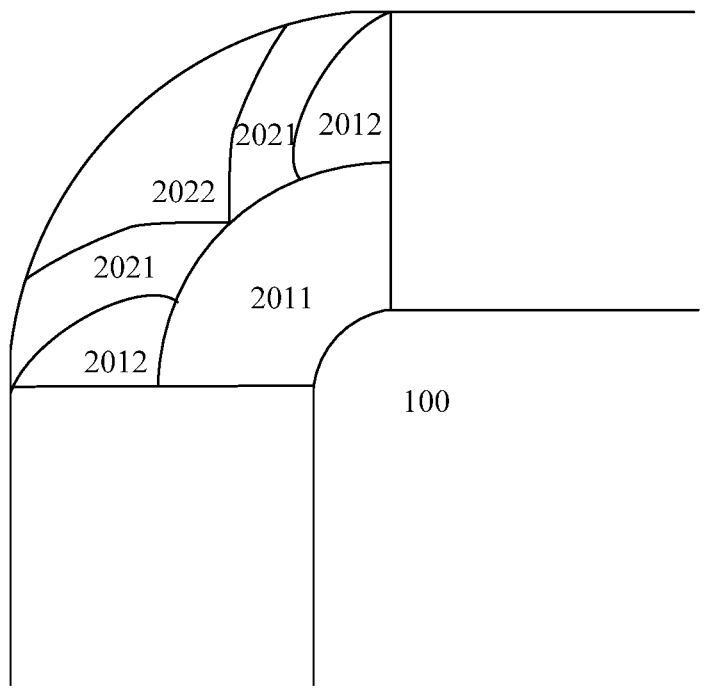
FIG. 5 is a schematic diagram of a partition structure of a corner display region of a display substrate according to an embodiment of the present disclosure.

In an exemplary embodiment, as shown in FIG. 5, the first display region 201 includes a first sub-region 2011 and a second sub-region 2012. The first sub-region 2011 is located between the second sub-region 2012 and the main display region 100. The second sub-region 2012 is located between the second display region 202 and the first sub-region 2011.

In an exemplary embodiment, as shown in FIG. 5, the corner display regions include a first fan-shaped region located at a side of the main display region 100 and a second annular region located at a side of the first fan-shaped region away from the main display region 100. The first sub-region 2011 is located in the first fan-shaped region. Each corner display region includes two second sub-regions 2012, the two second sub-regions 2012 and the second display region 202 are all located in the second annular region, and the second display region 202 is located between the two second sub-regions 2012.

In this exemplary embodiment, the first sub-region 2011 and the second sub-region 2012 have less demand for deformability. Thus, the inorganic layers of the first sub-region 2011 and the second sub-region 2012 may be processed by thinning to reduce the overall rigidity of the display panels of the first sub-region 2011 and the second sub-region 2012.

In an exemplary embodiment, as shown in FIG. 5, the second display region 202 includes a third sub-region 2021 and a fourth sub-region 2022. The third sub-region 2021 is located between the fourth sub-region 2022 and the first display region 201, and the fourth sub-region 2022 is located at a side of the third sub-region 2021 away from the main display region 100.

In an exemplary embodiment, the third sub-region 2021 is provided with a plurality of first island regions 201a separated from each other, first hole regions 201c disposed between adjacent first island regions 201a, and first bridge regions 201b connecting the adjacent first island regions 201a. The first island regions 201a are provided with sub-pixels of the first display region 201, the first bridge regions 201b are provided with connecting wires for implementing signal communication between the adjacent first island regions 201a, and the first hole regions 201c are provided with at least one first opening.

The fourth sub-region 2022 is provided with a plurality of second island regions 202a separated from each other, second hole regions 202c disposed between adjacent second island regions 202a, and second bridge regions 202b connecting the adjacent second island regions 202a. The second island regions 202a are provided with sub-pixels of the second display region 202, the second bridge regions 202b are provided with connecting lines for implementing signal communication between the adjacent second island regions 202a, and the second hole regions 202c are provided with at least one second opening.

A pattern of the first opening is different from a pattern of the second opening, an orthographic projection area of the first opening on the substrate is smaller than an orthographic projection area of the second opening on the substrate. Or, the pattern of the first opening is the same as the pattern of the second opening, and a size of the first opening is smaller than a size of the second opening.

In this exemplary embodiment, compared with the first sub-region 2011 and the second sub-region 2012, the third sub-region 2021 and the fourth sub-region 2022 have a greater demand for deformability. By arranging opening structures for both the third sub-region 2021 and the fourth sub-region 2022 the deformability of the third sub-region 2021 and the fourth sub-region 2022 is improved. And compared with the third sub-region 2021, the fourth sub-region 2022 has a greater demand for deformability. Therefore, different opening patterns and/or opening sizes may be designed for the openings of the third sub-region 2021 and the fourth sub-region 2022, so that gradually increased deformability of the third sub-region 2021 to the fourth sub-region 2022 is achieved.

According to the display substrate of the embodiment of the disclosure, based on the different demands for deformability in each of four corner regions, corresponding structural design can achieve the transition effect of different Pixels Per Inch (PPI), which not only improves the display quality of the four corner regions, but also takes into account demand for the deformation of the four corner regions.

Figure 6:
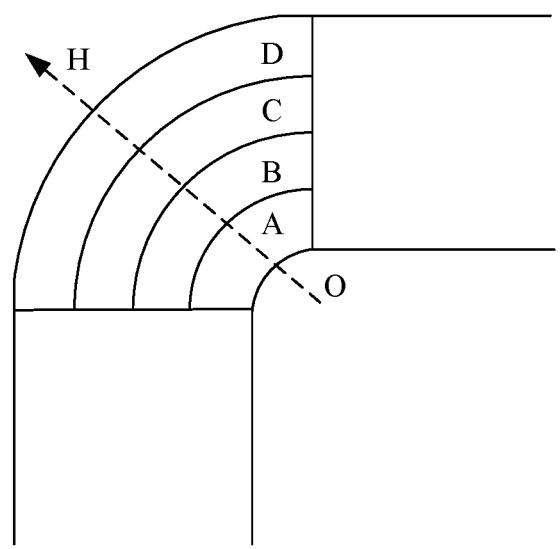
FIG. 6 is a schematic diagram of a partition structure of a corner display region of a display substrate along a central axis direction of the corner display region according to an embodiment of the present disclosure.

As shown in FIG. 6, the deformability of different regions gradually increases along a central axis OH of a corner display region. Therefore, the corner display region can be divided into several sub-regions along the central axis OH. For example, the corner display region can be divided into four sub-regions A, B, C, and D along the central axis OH, and demand for the deformability is A<B<C<D.

Figure 7:
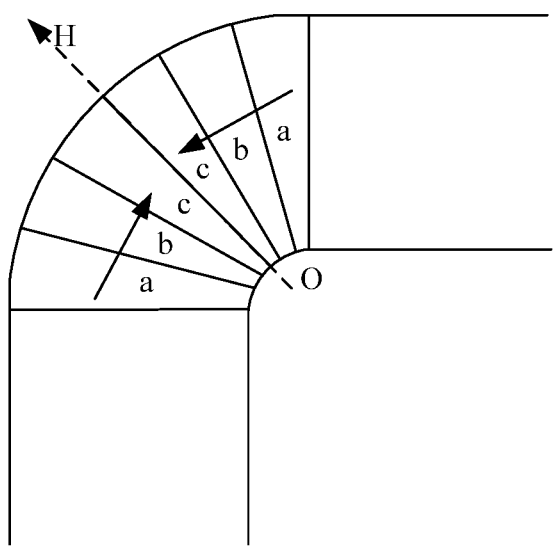
FIG. 7 is a schematic diagram of a partition structure of a corner display region of a display substrate in a direction from two sides of the corner display region toward a central axis of the corner display region according to an embodiment of the present disclosure.

As shown in FIG. 7, the deformability of different regions gradually increases in a direction from two sides of the corner display region to the central axis OH. Therefore, the corner display region can be divided into several sub-regions in the direction from two sides of the corner display region to the central axis OH. For example, the corner display region can be divided into three sub-regions a, b and c in the direction from two sides of the corner display region toward the central axis OH, and demand for the deformability is a<b<c.

Figure 8:
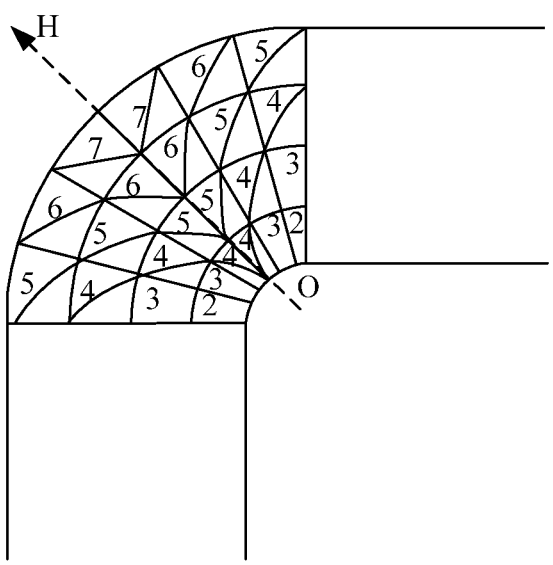
FIG. 8 is a schematic diagram of a sub-region distribution form in which two sub-region division modes of FIG. 6 and FIG. 7 are integrated.

As the above two directions are the main direction with deformations influence, after integrating demand for the deformation of regions of FIG. 6 and FIG. 7, a distribution form shown in FIG. 8 is obtained. It can be seen that along the direction of the central axis OH of the corner display region, demand for the deformability gradually increases, and the distribution is consistent with the actual fold situation after fitting. The sub-regions with the same deformability demand are integrated, a distribution structure of the sub-regions from an I-th sub-region to a V-th sub-region shown in FIG. 9 may be obtained.

Figure 9:
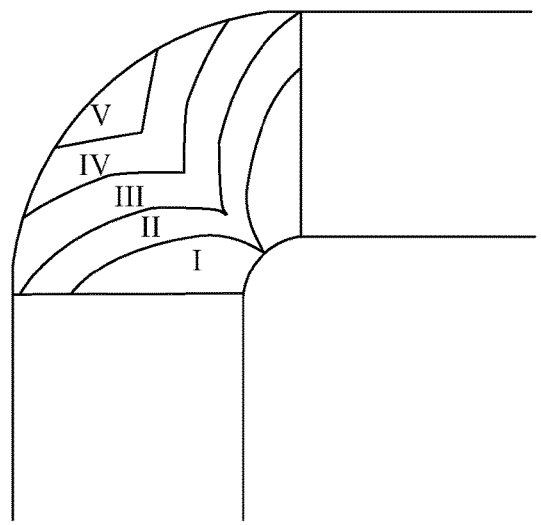
FIG. 9 is a simplified schematic diagram of a sub-region distribution form shown in FIG. 8.

In some exemplary embodiments, distribution structure of the sub-regions shown in FIG. 9 may be simplified, for example, after simplifying the distribution structure of the sub-regions shown in FIG. 9, a distribution structure of four sub-regions shown in FIG. 5 may be obtained.

In this exemplary embodiment, the main display region 100 does not need to be deformed, so the sub-pixels of the main display region 100 may use a conventional design structure. The first sub-region 2011 and the second sub-region 2012 have less demand for deformability, and has a shallow fitting depth on a glass cover plate. The overall rigidity of the panels of the first sub-region 2011 and the second sub-region 2012 may be reduced by thinning an inorganic layer between the sub-pixels.

The third sub-region 2021 may be designed as a straight-line opening tensile structure, which has certain deformability, and PPI of the third sub-region 2021 is slightly lower than that of the first sub-region 2011 and the second sub-region 2012 because it is needed to increase the opening structure.

The fourth sub-region 2022 may be designed as an I-shaped opening structure, which has a great demand for deformability, and the deformability of the fourth sub-region 2022 is better than that of the straight line-shaped opening structure, but PPI of the fourth sub-region 2022 is the smallest in the corner display region.

According to the above design, the PPI of the corner display region can gradually transitioned. From the main display region 100 to the first sub-region 2011 and further to the fourth sub-region 2022 of the corner display region, the PPI is gradually decreased and smoothly transitioned.

The following is an exemplary explanation through a manufacturing process of a display substrate. The "patterning process" mentioned in the embodiments of the present disclosure includes processes, such as photoresist coating, mask exposure, development, etching and photoresist stripping for metal materials, inorganic materials or transparent conductive materials, and includes organic material coating, mask exposure and development for organic materials. Deposition may be implemented by any one or more of sputtering, the evaporation and chemical vapor deposition, coating may be implemented by any one or more of spraying coating, spin coating and ink-jet printing, and the etching may be implemented by any one or more of dry etching and wet etching, and these are not limited in the present disclosure. A "thin film" refers to a layer of thin film manufactured by a certain material on a substrate by using deposition, coating or another process. If the "thin film" does not need a patterning process during the whole manufacturing process, the "thin film" can also be called a "layer". If the "thin film" needs a patterning process in the whole manufacturing process, it is referred to as a "thin film" before the patterning process and as a "layer" after the patterning process. The "layer" after the patterning process contains at least one "pattern". In the present disclosure, "A and B are disposed on the same layer" indicates that A and B are simultaneously formed by the same patterning process, and a "thickness" of the film layer is the dimension of the film layer in a direction perpendicular to the display substrate. In an exemplary embodiment of the present disclosure, "an orthographic projection of B lies within the range of an orthographic projection of A" means that a boundary of the orthographic projection of B falls within a boundary range of the orthographic projection of A, or the boundary of the orthographic projection of A overlaps with the boundary of the orthographic projection of B.

In an exemplary embodiment, as shown in FIG. 1, the display substrate includes the main display region 100 and corner display regions, and each of the corner display regions includes a first display region 201 and a second display region 202. Sub-pixels in the first display region 201 have a first structure, and sub-pixels in the second display region 202 have a second structure, and the deformability of the first structure is smaller than that of the second structure.

In an exemplary embodiment, the manufacturing process of the display substrate includes the following operations.

(1) A flexible material is coated on a glass carrier plate 1, and is cured to form a film to form the substrate 10. In this exemplary embodiment, the substrate 10 is a flexible substrate with a thickness of 5 m to 30 m. The flexible material may be polyimide (PI), polyethylene terephthalate (PET) or a surface-treated polymer soft film or the like.

Figure 10:
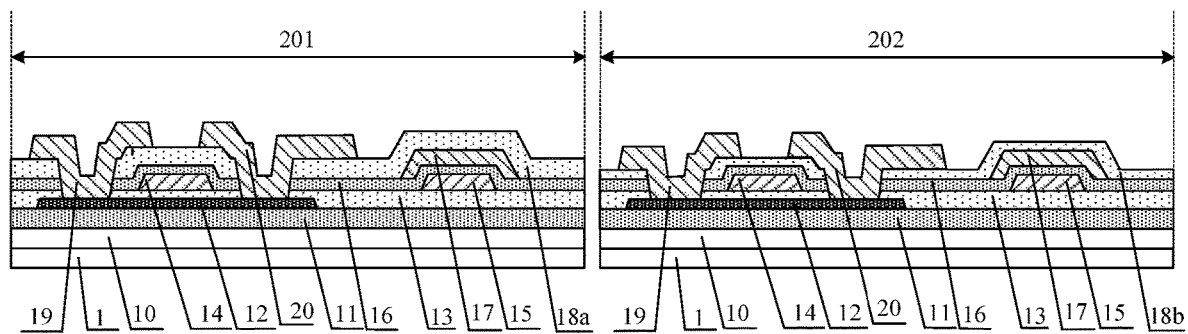
FIG. 10 is a schematic diagram of a structure of a display substrate after a driving structure layer is formed according to the present disclosure.

(2) A driving structure layer pattern is manufactured on the substrate 10. The driving structure layer includes a plurality of gate lines and a plurality of data lines. The plurality of gate lines and the plurality of data lines cross perpendicularly to define a plurality of sub-pixels arranged in a matrix, and each sub-pixel is provided with a thin film transistor, as shown in FIG. 10. In an exemplary embodiment, the manufacturing process of the driving structure layer may include the following operations.

First, a barrier film is deposited on the substrate 10 to form a pattern of a barrier layer 11. The barrier film may use silicon nitride (SiNx), silicon oxide (SiOx) or the like, it may be a single layer or may be a multi-layer structure of the silicon nitride/silicon oxide. In this exemplary embodiment, the barrier layer 11 is used for improving a capability of water oxygen resistance of the substrate 10. In this patterning process, a thickness of the barrier layer 11 in the first display region 201 is as the same with the thickness of the barrier layer 11 in the second display region 202, or the thickness of the barrier layer 11 in the second display region 202 may be smaller than the thickness of the barrier layer 11 in the first display region 201, that is, the barrier layer 11 in the second display region 202 may be thinned.

Next, an active layer film is deposited and is patterned through a patterning process to form a pattern of an active layer 12 disposed on the barrier layer 11 in a pixel island region.

Subsequently, a first insulating film and a first metal film are sequentially deposited, and the first metal film is patterned by a patterning process to form a pattern of a first insulating layer 13 covering the active layer 12 in the pixel island region, a first gate electrode 14 and a second gate electrode 15 and a gate line (not shown in the drawings) disposed on the first insulating layer 13.

Subsequently, a second insulating film and a second metal film are sequentially deposited, and the second metal film is patterned by a patterning process to form a pattern of a second insulating layer 16 covering the first gate electrode 14, the second gate electrode 15, and the gate line, and pattern of a capacitance electrode 17 disposed on the second insulating layer 16 in the pixel island region. A position of the capacitance electrode 17 corresponds to a position of the second gate electrode 15, and the capacitance electrode 17 and the second gate electrode 15 form a capacitor.

Subsequently, a third insulating film is deposited and patterned by a Half Tone Mask to form a pattern of a third insulating layer 18 with at least two first vias. The third insulating film, the second insulating film and the first insulating film in at least two first vias are etched away, to expose two ends of the active layer 12. The thickness of the third insulating layer 18 in the second display region 202 is smaller than the thickness of the third insulating layer 18 in the first display region 201, that is, the third insulating layer 18 of the second display region 202 is thinned to facilitate the stretching and deformation of the second display region 202. The first insulating layer and the second insulating layer are also called a gate insulating layer (GI), and the third insulating layer is also called an interlayer insulating layer (also referred to as Interlayer Dielectric ILD). In this patterning process, the third insulating films, the second insulating films and the first insulating films in the connecting the bridge regions and the hole regions are etched away.

Subsequently, a third metal film is deposited and is patterned through a patterning process to form patterns of a source electrode 19, a drain electrode 20 and a data line (not shown in the drawings). The source electrode 19 and the drain electrode 20 are connected to the active layer 12 respectively through two first vias. So far, manufacturing of the pattern of the driving structure layer on the substrate 10 is achieved.

(3) A fourth insulating film is coated on the substrate on which the above patterns are formed, and a pattern of a fourth insulating layer 21 covering the source electrode 19 and the drain electrode 20 is formed in the pixel island region through photolithography processes of exposure and development of the mask. The fourth insulating layer 21 is provided with a second via exposing the drain electrode 20. The fourth insulating layer is also called a planarization layer (PLN).

(4) A transparent conductive film is deposited on the substrate on which the above patterns are formed, and is patterned through a patterning process to form a pattern of an anode 31 in the pixel island region. The anode 31 is connected to the drain electrode 20 through the second via, as shown in FIG. 5. The transparent conductive film may be made of indium tin oxide (ITO) or indium zinc oxide (IZO).

(5) A pixel define film is coated on the substrate on which the above patterns are formed, and a pattern of a pixel define layer is formed by photolithography. The pixel define layer 32 defines a pixel opening region exposing the anode 31 in each sub-pixel, and the pixel define layer may be made of polyimide, acrylic or polyethylene terephthalate, etc.

(6) An organic light emitting material and a cathode metal film are sequentially evaporated on the substrate on which the above patterns are formed, to form patterns of an organic light emitting layer 33 and a cathode 34. The organic light emitting layer 33 is connected to the anode 31 in the pixel opening region defined by the pixel define layer 32, and the cathode 34 is disposed on the organic light emitting layer 33. The organic light emitting layer 33 includes a light emitting layer (EML). In one implementation, the organic light emitting layer 33 may include a hole injection layer, a hole transporting layer, a light emitting layer, an electron transporting layer, and an electron injection layer disposed sequentially to improve the efficiency of injecting electrons and holes into the light emitting layer. The cathode may be made of one of metal materials such as magnesium Mg, argentum Ag, aluminum Al, copper Cu, lithium Li, or an alloy made of one or more of the above metals.

(7) An encapsulation film is coated on the substrate on which the above patterns are formed, to form a pattern of an encapsulation layer 35. In one implementation, the encapsulation film may be made of a stacked structure such as an inorganic material/organic material/inorganic material.

(8) Finally, the glass carrier plate 1 is stripped to form a flexible display substrate according to an embodiment of the present disclosure, as shown in FIG. 2.

The description of the structure and manufacturing process of the display substrate according to embodiments of the present disclosure is merely illustrative. In an exemplary embodiment, corresponding structures may be changed and patterning processes may be added or reduced if required. For example, a step of thinning one or more layers of the barrier layer 11, the first insulating layer 13 and/or the second insulating layer 16 may be added if required. For example, an island bridge structure may be disposed in the second display region 202, and at this time, hole regions are disposed between adjacent island regions of the second display region 202. The hole regions may be I-shaped, straight line-shaped, T-shaped, etc. Or both the first display region 201 and the second display region 202 may be provided with island bridge structures. However, a structure of the hole regions between adjacent island regions of the first display region 201 may be different from a pattern and/or a size of the hole regions between adjacent island regions of the second display region 202. For example, the pattern of the hole regions of the first display region 201 may be straight line-shaped, and the pattern of the hole regions of the second display region 202 may be I-shaped, or the size of the hole regions of the second display region 202 may be larger than the size of the hole regions of the first display region 201, so as to facilitate the stretching deformation of the second display region 202. The present disclosure is not limited here.

It can be seen from the manufacturing process of the embodiment of the present disclosure that the display substrate in the embodiment of the present disclosure improves the display quality of the corner display regions, satisfies demand for the deformation of the corner display regions, and improves the product quality by region division design of the sub-pixels in the corner display regions. The manufacturing process of the display substrate according to the exemplary embodiment of the present disclosure has good process compatibility, simple process realization, easy implementation, high production efficiency, low production cost and high yield rate.

An embodiment of the present disclosure further provides a manufacturing method for a display substrate including a display region and a bezel region. The display region includes a main display region and a plurality of corner display regions, the corner display region includes a first display region and a second display region, and a distance between a center point of the first display region and a center point of the main display region is smaller than a distance between a center point of the second display region and the center point of the main display region. In an exemplary embodiment, as shown in FIG. 11, the manufacturing method includes: at step S1, forming, on a substrate, a driving structure layer, a structure of the driving structure layer formed in the first display region being different from a structure of the driving structure layer formed in the second display region; and at step S2, forming, on the driving structure layer, a light emitting structure layer.

In an exemplary embodiment, step S1 includes:
forming, on the substrate, a barrier layer and an active layer disposed on the barrier layer sequentially;
forming a first insulating layer covering the substrate and a first gate electrode layer disposed on the first insulating layer;
forming a second insulating layer covering the whole substrate and a second gate electrode layer disposed on the second insulating layer; and
forming a third insulating layer covering the second gate electrode layer, disposing first vias exposing two ends of the active layer on the third insulating layer, and making a thickness of the third insulating layer in the second display region smaller than a thickness of the third insulating layer in the first display region;
forming, on the third insulating layer, a source electrode and a drain electrode, the source electrode and the drain electrode being respectively connected with the active layer through the first vias.

In an exemplary embodiment, step S1 includes:
forming, in the second display region, a plurality of island regions distributed in an array and separated from each other, a plurality of hole regions and bridge regions located between the island regions and the hole regions, forming, in the bridge regions, connecting wires for implementing signal communication between adjacent island regions, and forming, in the hole regions, an opening penetrating through the substrate.

In an exemplary embodiment, step S1 includes:
forming, in the first display region, a plurality of first island regions distributed in an array and separated from each other, a plurality of first hole regions and first bridge regions located between the first island regions and the first hole regions, forming, in the first bridge regions, connecting wires for implementing signal communication between adjacent first island regions, and forming, in the first hole regions, a first opening penetrating through the substrate;
forming, in the second display region, a plurality of second island regions distributed in an array and separated from each other, a plurality of second hole regions and second bridge regions located between the second island regions and the second hole regions, forming, in the second bridge regions, connecting wires for implementing signal communication between adjacent second island regions, and forming, in the second hole regions, a second opening penetrating through the substrate; and
a pattern of the first opening is different from a pattern of the second opening, and an orthographic projection area of the first opening on the substrate is smaller than an orthographic projection area of the second opening on the substrate, or the pattern of the first opening is the same as the pattern of the second opening, and a size of the first opening is smaller than a size of the second opening.

In an exemplary embodiment, the first display region includes a first sub-region and a second sub-region, wherein the first sub-region is located between the second sub-region and the main display region; the second sub-region is located between the second display region and the first sub-region.

In an exemplary embodiment, the second display region includes a third sub-region and a fourth sub-region, wherein the third sub-region is located between the fourth sub-region and the first display region, and the fourth sub-region is located at a side of the third sub-region away from the main display region.

In an exemplary embodiment, step S1 includes:
forming, on the substrate, a barrier layer and an active layer disposed on the barrier layer sequentially;
forming a first insulating layer covering the substrate and a first gate electrode layer disposed on the first insulating layer;
forming a second insulating layer covering the whole substrate and a second gate electrode layer disposed on the second insulating layer; and
forming a third insulating layer covering the second gate electrode layer, disposing first vias exposing two ends of the active layer on the third insulating layer, and making both a thickness of the third insulating layer in the first sub-region and a thickness of the third insulating layer in the second sub-region smaller than a thickness of the third insulating layer in the main display region;
forming, on the third insulating layer, a source electrode and a drain electrode, the source electrode and the drain electrode being respectively connected with the active layer through the first vias.

In an exemplary embodiment, step S1 includes:
forming, in the third sub-region, a plurality of first island regions distributed in an array and separated from each other, a plurality of first hole regions and first bridge regions located between the first island regions and the first hole regions, forming, in the first bridge regions, connecting wires for implementing signal communication between adjacent first island regions, and forming, in the first hole regions, a first opening penetrating through the substrate;
forming, in the fourth sub-region, a plurality of second island regions distributed in an array and separated from each other, a plurality of second hole regions and second bridge regions located between the second island regions and the second hole regions, forming, in the second bridge regions, connecting wires for implementing signal communication between adjacent second island regions, and forming, in the second hole regions, a second opening penetrating through the substrate; and
a pattern of the first opening is different from a pattern of the second opening, and an orthographic projection area of the first opening on the substrate is smaller than an orthographic projection area of the second opening on the substrate, or the pattern of the first opening is the same as the pattern of the second opening, and a size of the first opening is smaller than a size of the second opening.

The manufacturing method of the display substrate provided by the embodiment of the present disclosure improves the display quality of the corner display regions, satisfies demand for the deformation of the corner display regions, and improves the product quality by region division design of the sub-pixels in the corner display regions. The exemplary embodiment of the present disclosure shows that the manufacturing process of the display substrate has good process compatibility, simple process realization, easy implementation, high production efficiency, low production cost and high yield rate.

An embodiment of the present disclosure further provides a display apparatus which includes any display substrate of the aforementioned embodiments. The display apparatus may be any product or component with a display function such as a mobile phone, a tablet computer, a television, a display, a notebook computer, a digital photo frame, or a navigator, etc.

Although the embodiments disclosed in the present disclosure are as described above, the described contents are only the embodiments for facilitating understanding of the present disclosure, which are not intended to limit the present disclosure. Those skilled in the art to which the present disclosure pertains can make any modifications and variations in the form and details of implementations without departing from the spirit and scope disclosed by the present disclosure. Nevertheless, the scope of patent protection of the present disclosure shall still be determined by the scope defined by the appended claims.

What we claim is:
1. A display substrate, comprising:
a display region and a bezel region, the display region comprising a plurality of sub-pixels, and the display region comprising a main display region and a plurality of corner display regions, wherein:
each corner display region comprises a first display region and a second display region, a distance between a center point of the first display region and a center point of the main display region is smaller than a distance between a center point of the second display region and the center point of the main display region;
the plurality of sub-pixels comprise sub-pixels of the main display region, sub-pixels of the first display region and sub-pixels of the second display region;

the second display region comprises a third sub-region and a fourth sub-region, wherein the third sub-region is located between the fourth sub-region and the first display region, and the fourth sub-region is located at a side of the third sub-region away from the main display region;

the third sub-region is provided with a plurality of first island regions separated from each other, first hole regions disposed between adjacent first island regions and first bridge regions connecting adjacent first island regions, wherein the first island regions are provided with sub-pixels of the first display region, the first bridge regions are provided with connecting wires for implementing signal communication between adjacent first island regions, and the first hole regions are provided with at least one first opening;

the fourth sub-region is provided with a plurality of second island regions separated from each other, second hole regions disposed between adjacent second island regions and second bridge regions connecting adjacent second island regions, wherein the second island regions are provided with sub-pixels of the second display region, the second bridge regions are provided with connecting wires for implementing signal communication between adjacent second island regions, and the second hole regions are provided with at least one second opening;

a pattern of the first opening is different from a pattern of the second opening, and an orthographic projection area of the first opening on the substrate is smaller than an orthographic projection area of the second opening on the substrate;

the pattern of the first opening may be T-shaped or -shaped, and the pattern of the second opening may be I-shaped; and deformability of the third sub-region to the fourth sub-region is gradually increased.

2. The display substrate according to claim 1, wherein the display substrate comprises a substrate and a driving structure layer and a light emitting structure layer stacked on the substrate, the driving structure layer comprises a barrier layer, an active layer disposed on the barrier layer, a first insulating layer disposed on the active layer, a first gate electrode layer disposed on the first insulating layer, a second insulating layer disposed on the first gate electrode layer, a second gate electrode layer disposed on the second insulating layer, a third insulating layer disposed on the second gate electrode layer, and a source-drain electrode layer disposed on the third insulating layer, and a thickness of at least one of the barrier layer, the first insulating layer, the second insulating layer, and the third insulating layer on the second display region is smaller than a thickness of the at least one of the barrier layer, the first insulating layer, the second insulating layer, and the third insulating layer on the first display region.

3. The display substrate according to claim 1, wherein the display substrate comprises a substrate and a driving structure layer and a light emitting structure layer stacked on the substrate, the driving structure layer comprises a barrier layer, an active layer disposed on the barrier layer, a first insulating layer disposed on the active layer, a first gate electrode layer disposed on the first insulating layer, a second insulating layer disposed on the first gate electrode layer, a second gate electrode layer disposed on the second insulating layer, a third insulating layer disposed on the second gate electrode layer, and a source-drain electrode layer disposed on the third insulating layer, and a thickness of at least one of the barrier layer, the first insulating layer, the second insulating layer, and the third insulating layer on the first display region is smaller than a thickness of the at least one of the barrier layer, the first insulating layer, the second insulating layer, and the third insulating layer on the main display region;

the second display region is provided with a plurality of island regions separated from each other, hole regions disposed between adjacent island regions, and bridge regions connecting adjacent island regions, wherein sub-pixels of the second display region are disposed in the island regions, the bridge regions are provided with connecting wires for implementing signal communication between adjacent island regions, and the hole regions are provided with at least one opening.

4. The display substrate according to claim 1, wherein the first display region is provided with a plurality of first island regions separated from each other, first hole regions disposed between adjacent first island regions and first bridge regions connecting adjacent first island regions, wherein the first island regions are provided with sub-pixels of the first display region, the first bridge regions are provided with connecting wires for implementing signal communication between adjacent first island regions, and the first hole regions are provided with at least one first opening;

the second display region is provided with a plurality of second island regions separated from each other, second hole regions disposed between adjacent second island regions and second bridge regions connecting adjacent second island regions, wherein the second island regions are provided with sub-pixels of the second display region, the second bridge regions are provided with connecting wires for implementing signal communication between adjacent second island regions, and the second hole regions are provided with at least one second opening; and a pattern of the first opening is different from a pattern of the second opening, and an orthographic projection area of the first opening on the substrate is smaller than an orthographic projection area of the second opening on the substrate.

5. The display substrate according to claim 1, wherein the first display region is provided with a plurality of first island regions separated from each other, first hole regions disposed between adjacent first island regions and first bridge regions connecting adjacent first island regions, wherein the first island regions are provided with sub-pixels of the first display region, the first bridge regions are provided with connecting wires for implementing signal communication between adjacent first island regions, and the first hole regions are provided with at least one first opening;

the second display region is provided with a plurality of second island regions separated from each other, second hole regions disposed between adjacent second island regions and second bridge regions connecting adjacent second island regions, wherein the second island regions are provided with sub-pixels of the second display region, the second bridge regions are provided with connecting wires for implementing signal communication between adjacent second island regions, and the second hole regions are provided with at least one second opening; and a pattern of the first opening is the same as a pattern of the second opening, and a size of the first opening is smaller than a size of the second opening.

6. The display substrate according to claim 1, wherein the first display region comprises a first sub-region and a second sub-region, wherein the first sub-region is located between the second sub-region and the main display region; and the second sub-region is located between the second display region and the first sub-region.

7. The display substrate according to claim 6, wherein the corner display region comprise a first fan-shaped region located at a side of the main display region and a second annular region located at a side of the first fan-shaped region away from the main display region, and the first sub-region is located in the first fan-shaped region, wherein each of the corner display regions comprises two second sub-regions, the two second sub-regions and the second display region are all located in the second annular region, and the second display region is located between the two second sub-regions.

8. A display apparatus, comprising:
a display substrate which comprises a display region and a bezel region, the display region comprising a plurality of sub-pixels, and the display region comprising a main display region and a plurality of corner display regions, wherein:
each corner display region comprises a first display region and a second display region, a distance between a center point of the first display region and a center point of the main display region is smaller than a distance between a center point of the second display region and the center point of the main display region;
the plurality of sub-pixels comprise sub-pixels of the main display region, sub-pixels of the first display region and sub-pixels of the second display region;
the second display region comprises a third sub-region and a fourth sub-region, wherein the third sub-region is located between the fourth sub-region and the first display region, and the fourth sub-region is located at a side of the third sub-region away from the main display region;
the third sub-region is provided with a plurality of first island regions separated from each other, first hole regions disposed between adjacent first island regions and first bridge regions connecting adjacent first island regions, wherein the first island regions are provided with sub-pixels of the first display region, the first bridge regions are provided with connecting wires for implementing signal communication between adjacent first island regions, and the first hole regions are provided with at least one first opening;
the fourth sub-region is provided with a plurality of second island regions separated from each other, second hole regions disposed between adjacent second island regions and second bridge regions connecting adjacent second island regions, wherein the second island regions are provided with sub-pixels of the second display region, the second bridge regions are provided with connecting wires for implementing signal communication between adjacent second island regions, and the second hole regions are provided with at least one second opening;
a pattern of the first opening is different from a pattern of the second opening, and an orthographic projection area of the first opening on the substrate is smaller than an orthographic projection area of the second opening on the substrate;
the pattern of the first opening may be T-shaped or ⊓-shaped, and the pattern of the second opening may be I-shaped; and
deformability of the third sub-region to the fourth sub-region is gradually increased.

9. The display apparatus according to claim 8, wherein the display substrate comprises a substrate and a driving structure layer and a light emitting structure layer stacked on the substrate, the driving structure layer comprises a barrier layer, an active layer disposed on the barrier layer, a first insulating layer disposed on the active layer, a first gate electrode layer disposed on the first insulating layer, a second insulating layer disposed on the first gate electrode layer, a second gate electrode layer disposed on the second insulating layer, a third insulating layer disposed on the second gate electrode layer, and a source-drain electrode layer disposed on the third insulating layer, and a thickness of at least one of the barrier layer, the first insulating layer, the second insulating layer, and the third insulating layer on the second display region is smaller than a thickness of the at least one of the barrier layer, the first insulating layer, the second insulating layer, and the third insulating layer on the first display region.

10. The display apparatus according to claim 8, wherein the display substrate comprises a substrate and a driving structure layer and a light emitting structure layer stacked on the substrate, the driving structure layer comprises a barrier layer, an active layer disposed on the barrier layer, a first insulating layer disposed on the active layer, a first gate electrode layer disposed on the first insulating layer, a second insulating layer disposed on the first gate electrode layer, a second gate electrode layer disposed on the second insulating layer, a third insulating layer disposed on the second gate electrode layer, and a source-drain electrode layer disposed on the third insulating layer, and a thickness of at least one of the barrier layer, the first insulating layer, the second insulating layer, and the third insulating layer on the first display region is smaller than a thickness of the at least one of the barrier layer, the first insulating layer, the second insulating layer, and the third insulating layer on the main display region; and
the second display region is provided with a plurality of island regions separated from each other, hole regions disposed between adjacent island regions, and bridge regions connecting adjacent island regions, wherein sub-pixels of the second display region are disposed in the island regions, the bridge regions are provided with connecting wires for implementing signal communication between adjacent island regions, and the hole regions are provided with at least one opening.

11. The display apparatus according to claim 8, wherein the first display region is provided with a plurality of first island regions separated from each other, first hole regions disposed between adjacent first island regions and first bridge regions connecting adjacent first island regions, wherein the first island regions are provided with sub-pixels of the first display region, the first bridge regions are provided with connecting wires for implementing signal communication between adjacent first island regions, and the first hole regions are provided with at least one first opening;
the second display region is provided with a plurality of second island regions separated from each other, second hole regions disposed between adjacent second island regions and second bridge regions connecting adjacent second island regions, wherein the second island regions are provided with sub-pixels of the second display region, the second bridge regions are provided with connecting wires for implementing signal communication between adjacent second island regions, and the second hole regions are provided with at least one second opening; and a pattern of the first opening is different from a pattern of the second opening, and an orthographic projection area of the first opening on the substrate is smaller than an orthographic projection area of the second opening on the substrate.

12. The display apparatus according to claim 8, wherein the first display region is provided with a plurality of first island regions separated from each other, first hole regions disposed between adjacent first island regions and first bridge regions connecting adjacent first island regions, wherein the first island regions are provided with sub-pixels of the first display region, the first bridge regions are provided with connecting wires for implementing signal communication between adjacent first island regions, and the first hole regions are provided with at least one first opening;

the second display region is provided with a plurality of second island regions separated from each other, second hole regions disposed between adjacent second island regions and second bridge regions connecting adjacent second island regions, wherein the second island regions are provided with sub-pixels of the second display region, the second bridge regions are provided with connecting wires for implementing signal communication between adjacent second island regions, and the second hole regions are provided with at least one second opening; and a pattern of the first opening is the same as a pattern of the second opening, and a size of the first opening is smaller than a size of the second opening.

13. The display apparatus according to claim 8, wherein the first display region comprises a first sub-region and a second sub-region, wherein the first sub-region is located between the second sub-region and the main display region; and the second sub-region is located between the second display region and the first sub-region.

14. The display apparatus according to claim 13, wherein the corner display region comprise a first fan-shaped region located at a side of the main display region and a second annular region located at a side of the first fan-shaped region away from the main display region, and the first sub-region is located in the first fan-shaped region, wherein each of the corner display regions comprises two second sub-regions, the two second sub-regions and the second display region are all located in the second annular region, and the second display region is located between the two second sub-regions.

15. A manufacturing method for a display substrate, the display substrate comprising a display region and a bezel region, the display region comprising a plurality of sub-pixels, the display region comprising a main display region and a plurality of corner display regions, each corner display region comprising a first display region and a second display region, the second display region being located at a side of the first display region far away from the main display region, and a distance between a center point of the first display region and a center point of the main display region is smaller than a distance between a center point of the second display region and the center point of the main display region, the manufacturing method comprising:

forming, on a substrate, a driving structure layer, wherein a structure of the driving structure layer formed in the first display region is different from a structure of the driving structure layer formed in the second display region; and forming, on the driving structure layer, a light emitting structure layer, wherein:

the plurality of sub-pixels comprise sub-pixels of the main display region, sub-pixels of the first display region and sub-pixels of the second display region;

the second display region comprises a third sub-region and a fourth sub-region, wherein the third sub-region is located between the fourth sub-region and the first display region, and the fourth sub-region is located at a side of the third sub-region away from the main display region;

the third sub-region is provided with a plurality of first island regions separated from each other, first hole regions disposed between adjacent first island regions and first bridge regions connecting adjacent first island regions, wherein the first island regions are provided with sub-pixels of the first display region, the first bridge regions are provided with connecting wires for implementing signal communication between adjacent first island regions, and the first hole regions are provided with at least one first opening;

the fourth sub-region is provided with a plurality of second island regions separated from each other, second hole regions disposed between adjacent second island regions and second bridge regions connecting adjacent second island regions, wherein the second island regions are provided with sub-pixels of the second display region, the second bridge regions are provided with connecting wires for implementing signal communication between adjacent second island regions, and the second hole regions are provided with at least one second opening;

a pattern of the first opening is different from a pattern of the second opening, and an orthographic projection area of the first opening on the substrate is smaller than an orthographic projection area of the second opening on the substrate;

the pattern of the first opening may be T-shaped or -shaped, and the pattern of the second opening may be I-shaped; and deformability of the third sub-region to the fourth sub-region is gradually increased.

* * * * *